United States Patent [19]
Oguchi

[11] Patent Number: 6,095,835
[45] Date of Patent: Aug. 1, 2000

[54] IC CARD CONNECTOR DEVICE WITH EJECT MECHANISM FOR EJECTING IC CARD

[75] Inventor: Wataru Oguchi, Miyagi-ken, Japan

[73] Assignee: Alps Electric Co., Ltd., Japan

[21] Appl. No.: 09/287,955

[22] Filed: Apr. 7, 1999

[30] Foreign Application Priority Data

Apr. 10, 1998 [JP] Japan .................................. 10-099406

[51] Int. Cl.[7] .................................................. H01R 13/62
[52] U.S. Cl. ........................................... 439/159; 439/160
[58] Field of Search ................................... 439/159, 152, 439/157, 160, 155

[56] References Cited

U.S. PATENT DOCUMENTS

| | | | |
|---|---|---|---|
| 5,499,925 | 3/1996 | Lwee ........................................ | 439/157 |
| 5,536,180 | 7/1996 | Ishida et al. ............................. | 439/159 |
| 5,558,527 | 9/1996 | Lin .......................................... | 439/159 |
| 5,575,669 | 11/1996 | Lin et al. ................................. | 439/157 |
| 5,984,702 | 11/1999 | Nishioka ................................. | 439/159 |
| 6,039,587 | 3/2000 | Oguchi .................................... | 439/159 |
| 6,042,401 | 3/2000 | Oguchi et al. .......................... | 439/159 |

FOREIGN PATENT DOCUMENTS 6-13072 2/1994 Japan .

*Primary Examiner*—Gary F. Paumen
*Assistant Examiner*—Tho D. Ta
*Attorney, Agent, or Firm*—Brinks Hofer Gilson & Lione

[57] ABSTRACT

A connector device in which a push rod can be locked in a predetermined approach position when an IC card is connected. The structure of an ejection mechanism is simplified, and the number of parts is reduced and assembling operability is improved. The push rod is held so as to reciprocate movably outside of a frame to guide insertion/removal of the IC card. The push rod is constantly biased by a partial force of the tension of a coil spring in an IC-card ejection direction, and a transmission pin attached to the push rod is constantly biased by a partial force of the tension of the coil spring toward an outer side surface of the frame. A heart-shaped cam groove engaged with an operation member of a transmission pin is provided in the outer side surface of the frame. When the IC card is inserted, the operation member is held in the cam groove, and the push rod is locked in the predetermined approach position. When the push rod, lock-released and projected, is pushed to the approach position, the transmission pin drives a driving plate entering the cam groove, to eject the IC card via an eject arm.

8 Claims, 6 Drawing Sheets

IC CARD CONNECTOR DEVICE WITH EJECT MECHANISM FOR EJECTING IC CARD

BACKGROUND OF THE INVENTION

The present invention relates to a connector device provided in an apparatus into/from which an IC card is inserted/removed, and more particularly, to an ejection mechanism to eject the IC card in inserted status.

Generally, a connector device for IC cards is schematically constructed with a pin header, having a number of pin contacts to be connected to socket contacts of an IC card, arrayed in a pin housing, a frame to guide the IC card when it is inserted/removed, an ejection mechanism to remove the IC card in inserted status from the pin contacts, and the like. Further, a connector device where the pin housing and the frame are integrated is known.

Conventionally, widely employed is a connector device where the ejection mechanism comprises a push rod held by the frame so as to reciprocate movably along an IC-card insertion/removal direction, and an eject lever rotatably supported by the frame or pin housing, and one end of the eject lever engages with the push rod. In the connector device having this ejection mechanism, if the push rod is pressed when an IC card is inserted, a claw of the eject lever which rotates being interlocked with the push rod presses the IC card forward. Accordingly, the IC card can be easily pulled out with fingers. However, as the push rod is projected forward when the IC card is inserted, the push rod may be operated by mistake or it may receive some shock, and thus the IC card may be unexpectedly ejected. In that case, connection with the IC card is broken and a trouble such as deletion of operation data occurs.

On the other hand, a connector device disclosed in Japanese Published Unexamined Utility-Model Application No. Hei 6-13072 comprises first and second transmission levers to link a push rod with a slide plate, a third transmission lever, pivotally supported by the first transmission lever and engaged/disengaged with the second transmission lever, and a heart-shaped cam mechanism to lock the push rod in a predetermined approach position and a projected position, so as to selectively transmit a pushing force with respect to the push rod to the slide plate in accordance with the amount of projection of the push rod. That is, when an IC card is inserted, the third transmission lever does not engage with the second transmission lever, and the push rod is in the approach position, being pushed by a predetermined amount. If the push rod is projected to the projected position by the heart-shaped cam mechanism and then further pulled forward, the third transmission lever engages with the second transmission lever in the position. In this status, if the push rod is pushed toward the approach position, the pushing force is transmitted via the respective transmission levers to the slide plate, then the slide plate presses the IC card forward, and ejects the IC card. Accordingly, when the IC card is connected, the push rod is locked in the approach position not projected forward, and only when the IC card is ejected, the push rod is projected forward. This construction prevents a fault of IC-card connection breakage resulting from erroneous operation of the push rod or the like.

In this manner, according to the connector device disclosed in the above published application, as the push rod can be locked in the predetermined approach position when the IC card is connected, the danger of erroneous operation of the push rod or application of shock to the push rod can be considerably reduced and the fault of IC-card connection breakage can be prevented. However, as the pushing force with respect to the push rod is selectively transmitted to the slide plate in accordance with the attitudes of the linked three transmission levers, the transmission mechanism is very complicated, and assembling operability is lowered.

SUMMARY OF THE INVENTION

The present invention has been made to provide a construction where a transmission pin attached to a push rod moves along a heart-shaped cam groove on a fixed side, the push rod can be locked respectively in a predetermined approach position and a projected position, and when the push rod, lock-released in the approach position and withdrawn to the projected position, is pushed toward the approach position, the transmission pin drives a driving body to eject an IC card via an eject arm. In this manner, as the push rod can be locked in a predetermined position or the driving body can be driven only upon a predetermined operation, in accordance with a trace position of the transmission pin with respect to the heart-shaped cam groove, the fault of IC-card connection breakage can be prevented. Further, a transmission mechanism for transmitting the pressing force between the push rod and the eject arm can be simplified, and assembling operability can be improved.

The present invention provides a connector device having a frame attachably/removably supporting an IC card, a push rod held by the frame so as to reciprocate movably, and a number of pin contacts connected to socket contacts of the IC card in inserted status, wherein the IC card in inserted status is ejected by pushing the push rod, the device further comprising: a heart-shaped cam groove fixed to the frame; a transmission pin attached to the push rod such that the push rod can move along the heart-shaped cam groove; a spring member, provided between the transmission pin and the frame, that elastically-biases the transmission pin toward the heart-shaped cam groove and elastically-biases the push rod in an IC-card ejection direction; a driving body movably held and adapted to be in contact with the transmission pin in a predetermined position; and an eject arm interlocked with the driving body, wherein the transmission pin is locked at two positions of the heart-shaped cam groove, whereby the push rod is locked in a predetermined approach position and a projected position projected from the approach position by a predetermined amount, and wherein when the IC card is inserted, by a first push operation with respect to the push rod in the approach position, the transmission pin is guided along the heart-shaped cam groove, thus the push rod withdraws to the projected position, and by a second push operation with respect to the push rod in the projected position, the transmission pin drives the driving body to eject the IC card via the eject arm.

This construction provides an ejection mechanism where only if the push rod projected forward by the first push operation is pushed to the approach position by the second push operation, the IC card is ejected. Accordingly, the fault of IC-card connection breakage can be prevented. Further, as the movement of the transmission pin tracing the heart-shaped cam groove is utilized so as to cause the eject arm to perform the IC card ejection operation only upon the second push operation, the structure of the pressing-force transmission mechanism between the push rod and the eject arm can be simplified. Further, to ensure the tracing movement of the transmission pin, the transmission pin must be elastically-biased toward the cam groove. Accordingly, as the transmission pin and the push rod are elastically-biased by the common spring member, the number of parts can be reduced, and the assembling operability can be greatly improved.

Note that it may be arranged such that when the IC card is ejected, the eject arm directly presses one end of the IC card. However, it is preferable that both ends of the IC card are pressed via another member connected to the eject arm since the IC card can be pressed straightforward in the ejection direction.

Further, in the above construction, if it is arranged such that a long groove to guide the driving body connected to the heart-shaped cam groove is provided, and when the IC card is inserted, the eject arm drives the driving body and a part of the driving body enters a moving area of the transmission pin within the heart-shaped cam groove, upon movement of the push rod from the projected position to the approach position, the transmission pin and the driving body can be reliably brought into contact.

Further, in the above construction, if it is arranged such that a guide portion to guide an IC card to be inserted/removed is provided in an inner side surface of the frame, and the heart-shaped cam groove is provided in an outer side surface of the frame, downsizing of the connector device can be promoted.

Further, in the above construction, if it is arranged such that a plurality of guide portions to individually guide a plurality of IC cards to be inserted/removed are provided in the inner side surface of the frame, and a plurality of push rods to individually eject the IC cards in inserted status are provided in the outer side surface of the frame, a connector device in which a plurality of IC cards can be individually inserted/removed can be realized.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Figure 1:
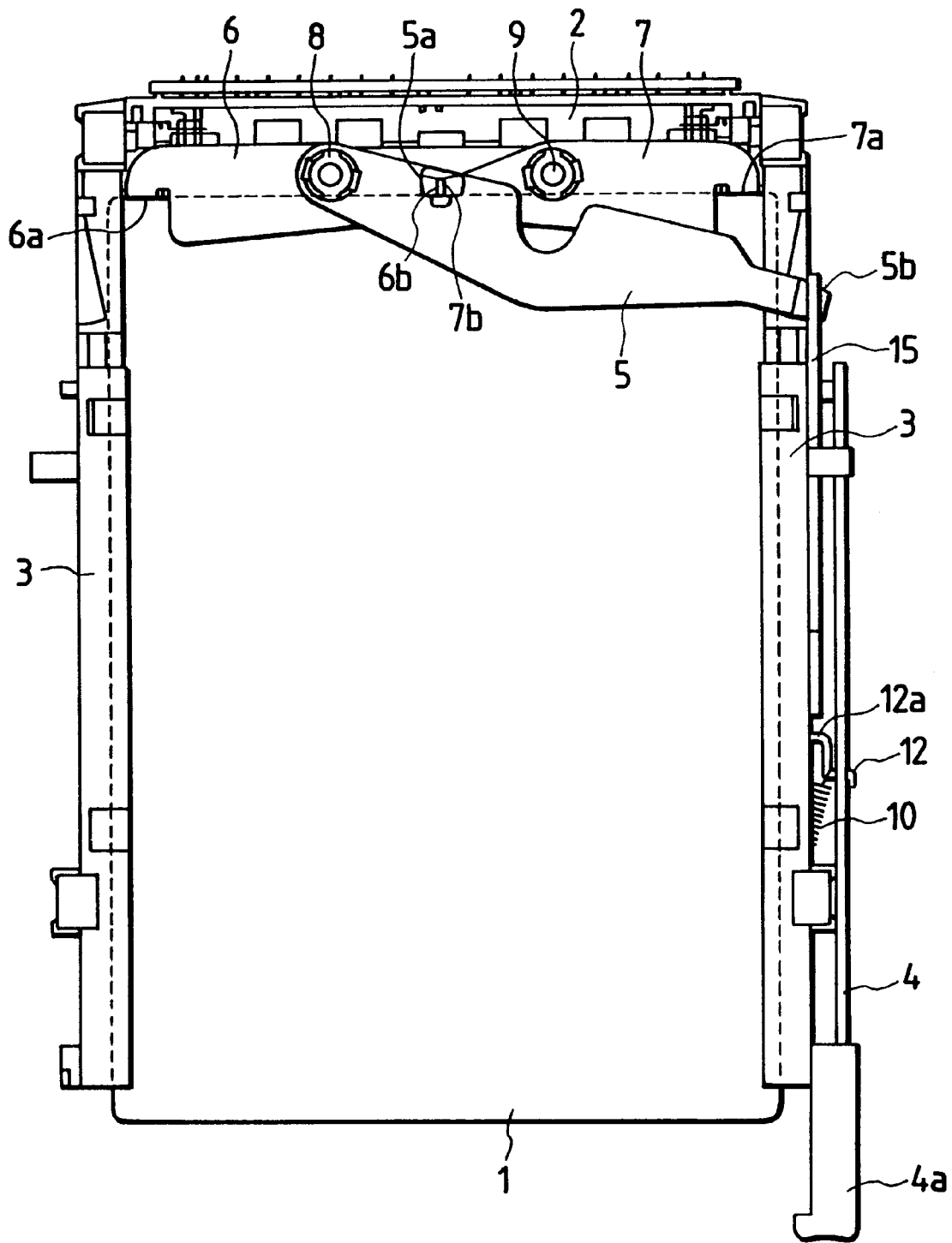
FIG. 1 is a plan view showing a connector device in which an IC card is inserted, according to an embodiment of the present invention.
Figure 2:
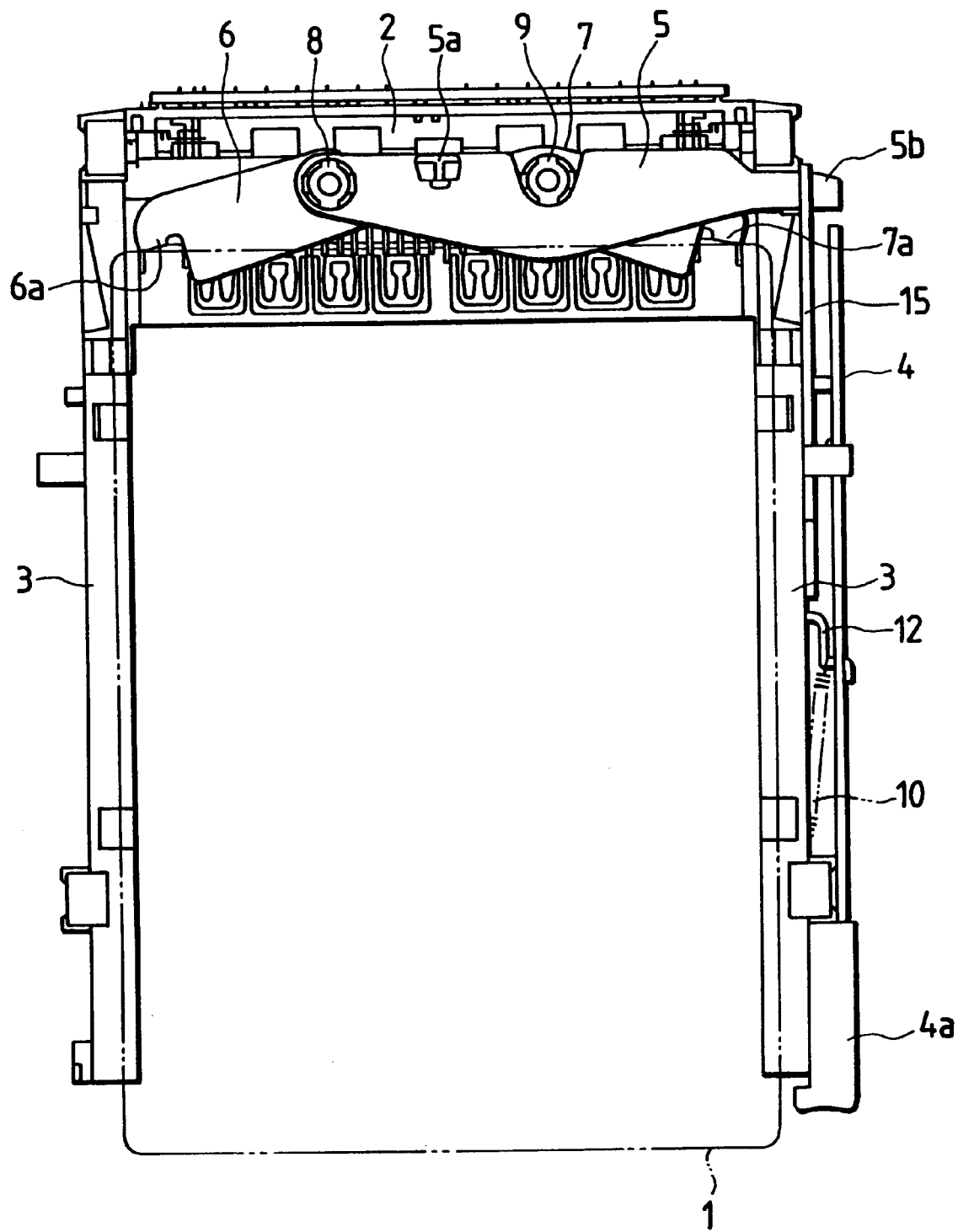
FIG. 2 is a plan view showing the connector device in a state immediately after removal of the IC card.

As shown in FIGS. 1 and 2, an IC card connector device according to an embodiment of the present invention mainly comprises a pin housing 2 having a number of pin contacts (not shown), press-fixed in a predetermined array, to be connected to socket contacts (not shown) in an IC card 1, a pair of frames 3, fixed to the right and left sides of the pin housing 2, to guide the IC card 1 when inserted/removed from both sides in a widthwise direction, a push rod 4 attached to one of the frames 3, an eject arm 5 pivotally attached to the pin housing 2, a first rotary arm 6 and a second rotary arm 7, an ejection mechanism provided between the push rod 4 and the eject arm 5, and the like.

The pin housing 2 has a first support shaft 8 and a second support shaft 9 with a predetermined interval therebetween. One end of the eject arm 5 is rotatably supported by the first support shaft 8. The eject arm 5 has a connection hole 5a and an engaging portion 5b. The engaging portion 5b extends toward the frame 3. The first rotary arm 6 is also rotatably supported by the first support shaft 8. The first rotary arm 6 has a claw 6a to push the IC card 1 and a tongue 6b extending into the connection hole 5a of the eject arm 5. On the other hand, the second rotary arm 7 is rotatably supported by the second support shaft 9. The second rotary arm 7 has a claw 7a to push the IC card 1 and a tongue 7b extending into the connection hole 5a of the eject arm 5.

Figure 3:
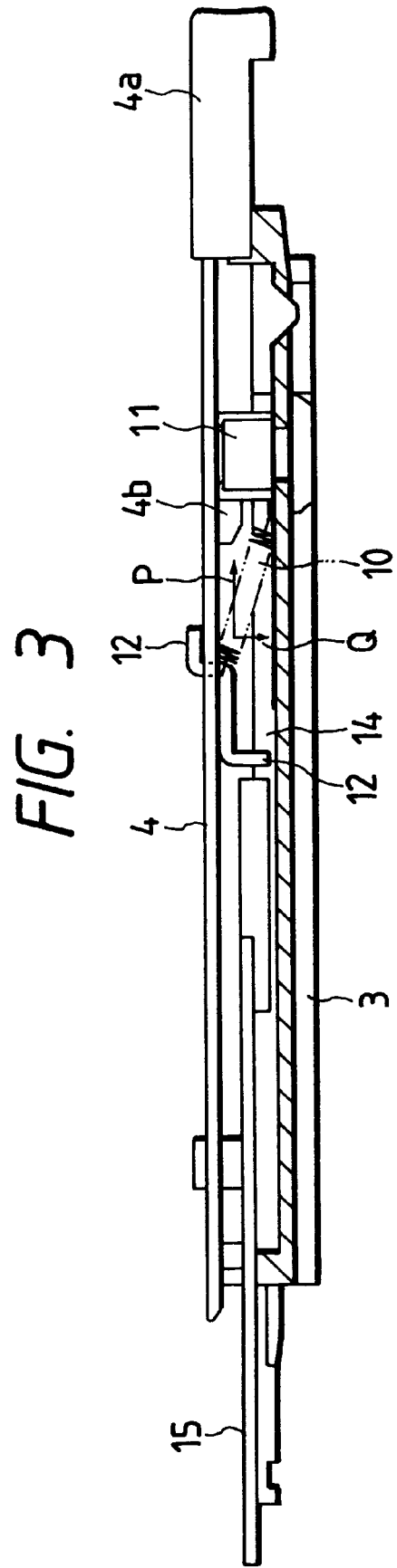
FIG. 3 is a plan view showing an ejection mechanism of the connector device.
Figure 4:
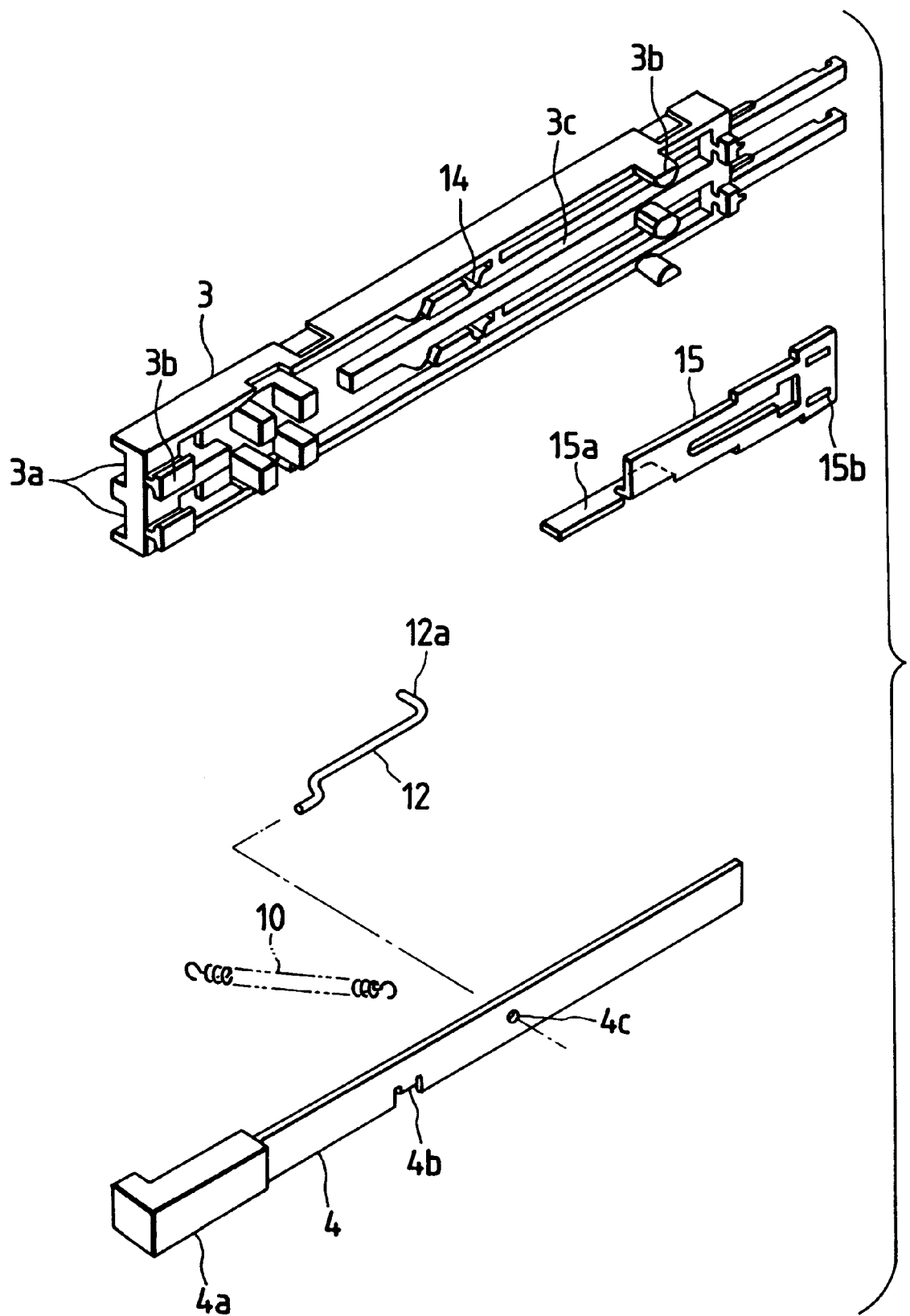
FIG. 4 is an exploded perspective view of the ejection mechanism.

Next, the construction of the ejection mechanism will be described in detail with reference to FIGS. 3 to 6. In the connector of the present embodiment, two IC cards 1 can be inserted along upper and lower guide grooves 3a formed in inner side surfaces of both frames 3. The connector has two push rods 4 to eject these IC cards 1. These push rods 4 have basically the same function and construction, therefore, description will be made on one push rod and its ejection mechanism (FIG. 4 shows only one push rod and its ejection mechanism).

The push rod 4 has a knob (operation member) 4a at its front end. The push rod 4 is held by a projection member 3b, provided on an external side surface of the frame 3 and engaged with the knob 4a, such that the push rod 4 reciprocates along an insertion/removal direction of the IC card 1. The push rod 4 is constantly elastically-biased by a partial force P (See FIG. 3) of tension of a coil spring 10, provided between a transmission pin 12 to be described later and the frame 3, toward an ejection direction of the IC card 1. As the movement in this direction is regulated when a stopper piece 4b formed on the push rod 4 comes into contact with an attachment metal member 11 fixed to the frame 3, the push rod 4 does not project from the predetermined projected position as shown in FIG. 3. Further, the transmission pin 12 having an L-shaped operation member 12a at its one end is rotatably supported in a hole 4c of the push rod 4, and the transmission pin 12 is stopped and drawn by the coil spring 10 toward the side of the frame 3. That is, as shown in FIG. 3, the coil spring 10 is expanded between the transmission pin 12 and the frame 3, and the transmission pin 12 is constantly elastically-biased by the partial force P of the tension of the coil spring 10 toward the outer side surface of the frame 3.

Figure 5:
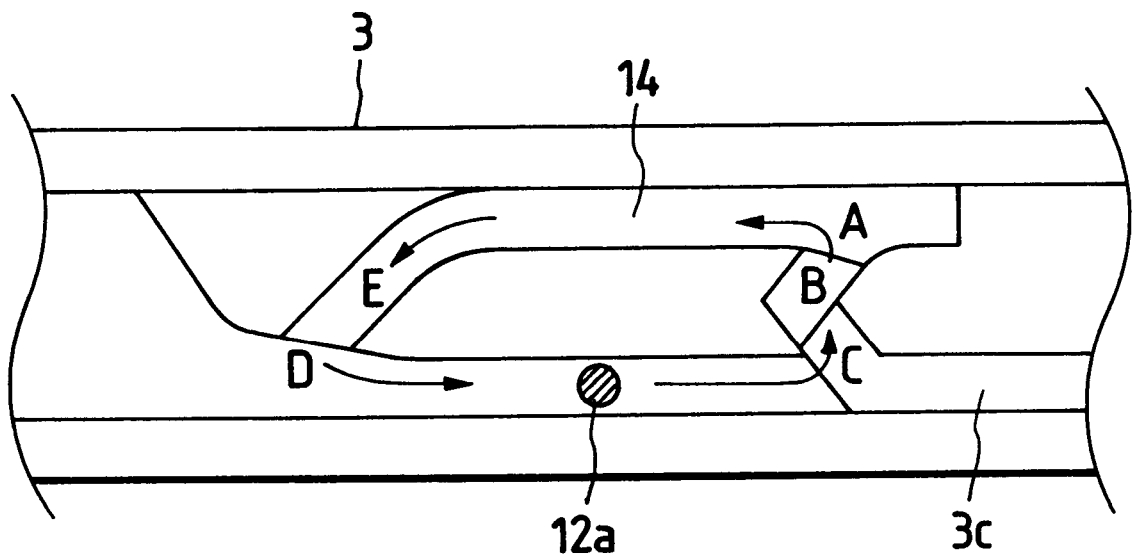
FIG. 5 is an explanatory view of a heart-shaped cam groove.
Figure 6:
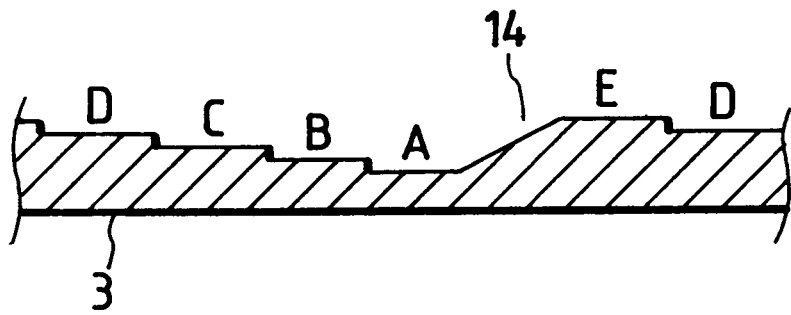
FIG. 6 is a developed cross sectional view showing cam surfaces of the heart-shaped cam groove.

A heart-shaped cam groove 14, engaged with the operation member 12a of the transmission pin 12, is formed in the outer side surface of the frame 3. As shown in FIGS. 5 and 6, the cam groove 14 has a plurality of cam surfaces A to E in different heights, and the operation member 12a of the transmission pin 12 traces these cam surfaces A to E along arrow directions in FIG. 5. Note that as the transmission pin 12 is constantly drawn by the tension (partial force Q) of the coil spring 10 toward the side of the frame 3, the operation member 12a moves in elastic contact with the respective cam surfaces A to E. Accordingly, the operation member 12a can smoothly move without getting out of the cam groove 14, thus performs exact tracing. Further, a driving plate 15 is held on the outside of the frame 3 such that it reciprocates along the insertion/removal direction of the IC card 1. A reception portion 15a bend-formed in the driving plate 15 is inserted into a long groove 3c formed in the outer side surface of the frame 3. The long groove 3c and the cam surface D of the cam groove 14 are linearly connected, so that the reception portion 15a of the driving plate 15 reciprocates between the long groove 3c and the cam surface D. Further, the driving plate 15 has an engaging hole 15b. The engaging hole 15b engages with the engaging portion 5b of the eject arm 5 outside of the frame 3.

In the connector device having the above construction, when the IC card 1 is not inserted, the push rod 4 is held in a predetermined position (approach position) approached from the projected position to the frame. At this time, as shown in FIG. 7A, the operation member 12a of the transmission pin 12 is stopped on the cam surface B of the cam groove 14, and the push rod 4 is held in the approach position in a stable manner by the tension (partial force P) of the coil spring 10 and the transmission pin 12 stopped in the cam groove 14.

When the IC card 1 is inserted along the guide groove 3a of the frame 3, the IC card 1 moving toward the pin housing 2 pushes claws 6a and 7a of the first and second rotary arms 6 and 7, thus press-inserts the pin contacts of the pin housing 2 into the socket contacts of the card itself. In this manner, by inserting the IC card 1 by a predetermined amount, the IC card 1 enters insertion-completed status where the IC card 1 is reliably connected with the respective pin contacts. At this time, the first rotary arm 6 and the second rotary arm 7 rotate in opposite directions respectively on the first support shaft 8 and the second support shaft 9 as rotation axes, and the rotation of these rotary arms 6 and 7 is transmitted via the claws 6b and 7b and the connection portion of the connection hole 5a to the eject arm 5. Then the eject arm 5 rotates on the first support shaft 8 as a rotation axis, and the driving plate 15 interlocked with the eject arm 5 moves forward along the frame 3. By this movement, as shown in FIG. 7B, the reception portion 15a of the driving plate 15 moves from the long groove 3c to the cam surface D of the cam groove 14. At this time, as the operation member 12a of the transmission pin 12 is stopped on the cam surface B, the reception portion 15a entering the cam groove 14 does not abut against the operation member 12a. That is, when the IC card 1 is connected, the reception portion 15a enters a movement area of the operation member 12a, however, as the operation member 12a is held in a position avoiding the reception portion 15a, the push rod 4 is maintained in the status where it is held in the approach position.

When the IC card in the inserted status is ejected from the connector device, first, the push rod 4 held in the approach position is pushed to release the lock status, and the push rod 4 is withdrawn to the front side by the tension of the coil spring 10. Thus the knob 4a is projected to the projected position as shown in FIGS. 1 and 3. That is, if the push rod 4 locked in the approach position is further pushed in an approach direction (IC card insertion direction) by a predetermined amount, the operation member 12a of the transmission pin 12 moves from the cam surface B of the cam groove 14 to the cam surface A, and moves from the cam surface A via the cam surface E to the cam surface D by the tension (partial force P) of the coil spring 10, as shown in FIG. 7C. Then, as shown in FIG. 7D, the push rod 4 moves in a projection direction (IC card ejection direction) to the projected position. At this time, the operation member 12a of the transmission pin 12 also does not abut against the reception portion 15a of the driving plate 15. Accordingly, when the push rod 4 moves to the projected position, the operation member 12a is opposite to the reception portion 15a on the cam surface D.

Figures 7A, 7B, 7C, 7D, 7E:
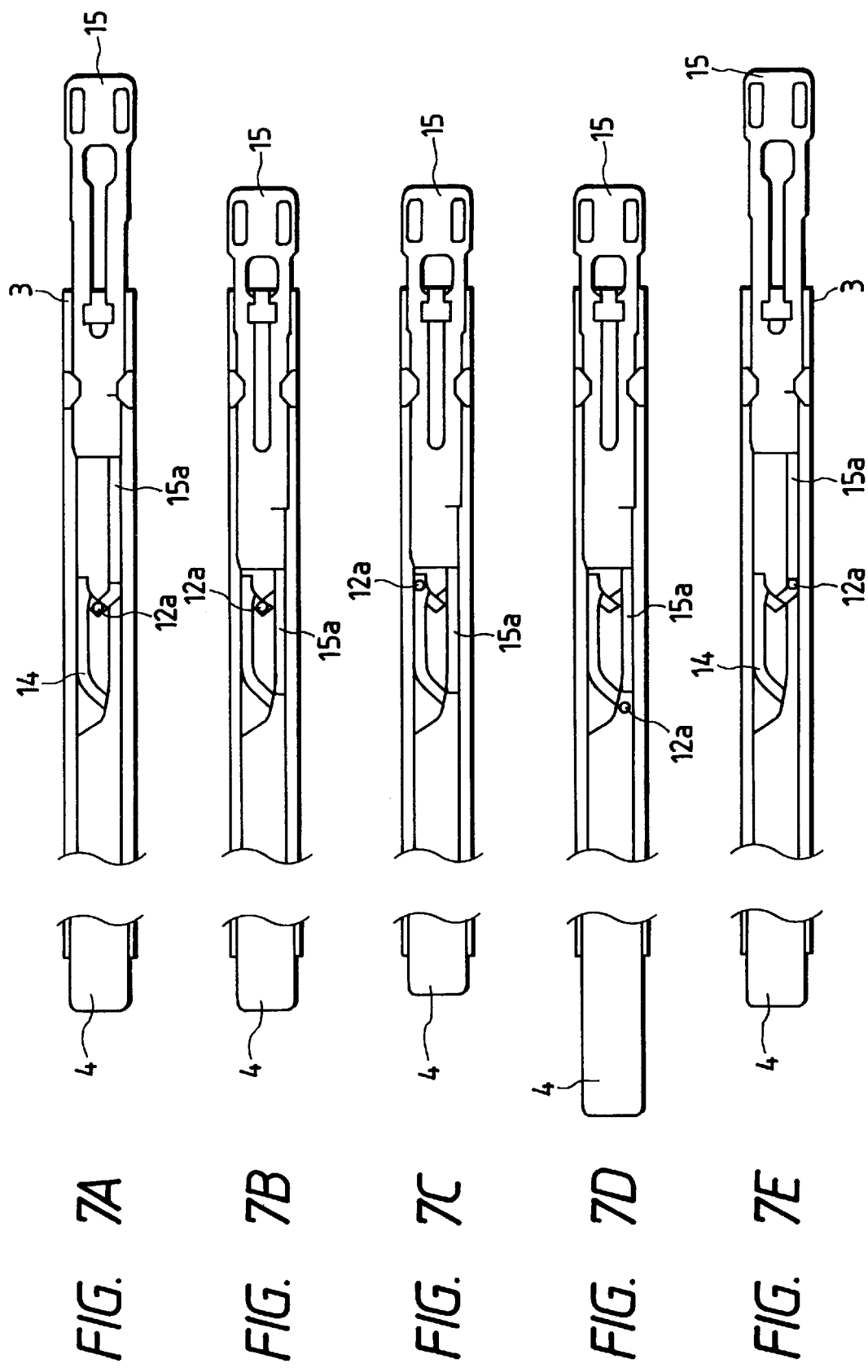
FIGS. 7A to 7E are explanatory views showing the operation of the ejection mechanism in FIGS. 3 and 4.

In this manner, when the push rod 4 has been moved to the projected position and the knob 4a of the push rod 4 is pushed in the approach direction, the operation member 12a of the transmission pin 12 moves from the cam surface D of the cam groove 14 via the cam surface C to the cam surface B, as shown in FIG. 7E, and stops on the cam surface B as shown in FIG. 7A. At this time, before the push rod 4 is again held in the approach position, the push rod 4 drives the driving plate 15 to perform operation ejection to eject the IC card 1 by the eject arm 5. That is, when the operation member 12a of the transmission pin 12 moves from the cam surface D to the cam surface C, the operation member 12a comes into contact with the reception portion 15a of the driving plate 15 and presses the reception portion 15a, then, the eject arm 5 engaged with the driving plate 15 rotates. In accordance with the rotation, the claws 6a and 7a of the first and second rotary arms 6 and 7 press both front ends of the IC card 1 almost straightforwardly in the ejection direction, and as represented by an alternate long and two short dashed line in FIG. 2, the press-inserted connection between the socket contacts of the IC card 1 and the pin contacts of the pin housing 2 is released. Accordingly, in this status, the IC card 1 can be easily ejected from the connector device by pulling the front part of the IC card 1 with fingers.

As described above, in the present embodiment, only if the push rod 4 projected forward by the first push operation is pushed to the approach position by the second push operation, the IC card 1 is ejected. Accordingly, the fault of IC-card connection breakage due to erroneous operation or shock with respect to the push rod 4 can be prevented. Further, as the movement of the transmission pin 12 tracing the heart-shaped cam groove 14 is utilized so as to cause the eject arm 5 to perform the IC card ejection operation only upon the second push operation, the pressing-force transmission mechanism between the push rod 4 and the eject arm 5 has a simple structure, which causes no trouble in assembling work. Further, in the present embodiment, as the push rod 4 and the transmission pin 12 are respectively elastically-biased by two-directional partial forces P and Q of the single coil spring 10, the number of parts can be reduced, and the assembling operability can be improved.

Note that in order to further simplify the construction, the eject arm 5 may directly press the IC card 1 to eject the card. However, the construction as the present embodiment to press both front ends of the IC card 1 via the first and second rotary arms 6 and 7 is more preferable, and constantly performs smooth ejection operation, since this construction can press the IC card 1 straightforwardly in the ejection direction.

Further, in the present embodiment, the long groove 3c formed in the frame 3 and the heart-shaped cam groove 14 are connected, and when the IC card 1 is inserted, the eject arm 5 drives the driving plate 15 to move the reception portion 15a to the cam surface D. Accordingly, the operation member 12a of the transmission pin 12 and the reception portion 15a of the driving plate 15 are reliably brought into contact. Thus, the reliability is ensured.

Further, in the present embodiment, as the heart-shaped cam groove 14 is provided in the outer side surface of the frame 3 having the guide groove 3a for insertion/removal of the IC card in its inner side surface, this construction is advantageous in downsizing and reduction of the number of parts of the device.

Note that in the above embodiment, two IC cards can be inserted into the connector device, however, the present invention is applicable to a connector device in which one IC card is inserted or a connector device in which three or more IC cards are inserted.

The present invention is embodied as the construction described above, and has advantages as described below.

That is, the transmission pin attached to the push rod moves along the heart-shaped cam groove on the fixed side, and the push rod can be locked respectively in the predetermined approach position and the projected position. Further, when the push rod, lock-released in the approach position and withdrawn to the projected position, is pushed toward the approach position, the transmission pin drives the driving body to eject the IC card via the eject arm. This construction prevents the fault of IC-card connection breakage due to erroneous operation or shock with respect to the push rod. Further, the pressing-force transmission mechanism between the push rod and the eject arm can be simplified. Further, as the transmission pin and the push rod are elastically-biased by the common spring member, the number of parts can be reduced, and the assembling operability can be improved.

Further, in the above construction, if it is arranged such that a long groove to guide the driving body is connected to the heart-shaped cam groove, and when the IC card is inserted, the eject arm drives the driving body and a part of the driving body enters a moving area of the transmission pin within the heart-shaped cam groove, upon movement of the push rod from the projected position to the approach position, the transmission pin and the driving body can be reliably come into contact.

Further, in the above construction, if it is arranged such that a guide portion to guide the IC card is provided in an inner side surface of the frame, and the heart-shaped cam groove is provided in an outer side surface of the frame, downsizing of the connector device can be promoted.

As many apparently widely different embodiments of the present invention can be made without departing from the spirit and scope thereof, it is to be understood that the invention is not limited to the specific embodiments thereof except as defined in the appended claims.

What is claimed is:

1. A connector device having a frame attachably/removably supporting an IC card, a push rod held by the frame so as to reciprocate movably, and a number of pin contacts connected to socket contacts of the IC card in an inserted status, wherein the IC card in inserted status is ejected by pushing said push rod, said device further comprising:

a heart-shaped cam groove fixed to said frame;
   a transmission pin attached to said push rod such that said push rod can move along the heat-shaped cam groove;
   a spring member, provided between said transmission pin and said frame, that elastically-biases said transmission pin toward said heart-shaped cam groove and elastically-biases said push rod in an IC-card ejection direction;
   a driving body held at said frame such that the driving body is movable in a reciprocating direction of said push rod, the driving body abutted against said transmission pin at a predetermined position; and
   an eject arm interlocked with said driving body,
   wherein said transmission pin is locked at two positions of said heart-shaped cam groove, whereby said push rod is locked in a predetermined approach position and a projected position projected from the approach position by a predetermined amount,
   wherein the approach position is in an IC card insertion direction and the projected position is in the IC card ejection direction;
   and wherein when the IC card is in the inserted status, by a first push operation with respect to said push rod in said approach position, said transmission pin is guided along said heart-shaped cam groove, thus said push rod withdraws to said projected position, and by a second push operation with respect to said push rod in said projected position, said transmission pin drives said driving body to said approach position to eject the IC card via said eject arm.

2. A connector device according to claim 1, wherein a plurality of guide portions to individually guide a plurality of IC cards to be inserted/removed are provided in an inner side surface of said frame, and a plurality of push rods to individually eject the IC cards in inserted status are provided in an outer side surface of said frame.

3. A connector device according to claim 1, wherein said spring member comprises a coil spring, one end of the coil spring is engaged with said transmission pin and an opposing end of the coil spring is engaged with said frame.

4. A connector device according to claim 1, further comprising a long groove, connected to said heart-shaped cam groove, to guide said driving body,
   wherein when the IC card is inserted, said eject arm drives said driving body such that a part of said driving body enters a moving area of said transmission pin within said heart-shaped cam groove, upon movement of said push rod from said projected position to said approach position.

5. A connector device according to claim 4, wherein a guide portion to guide an IC card to be inserted/removed is provided in an inner side surface of said frame, and said heart-shaped cam groove is provided in an outer side surface of said frame.

6. A connector device according to claim 4, wherein a plurality of guide portions to individually guide a plurality of IC cards to be inserted/removed are provided in an inner side surface of said frame, and a plurality of push rods to individually eject the IC cards in inserted status are provided in an outer side surface of said frame.

7. A connector device according to claim 1, wherein a guide portion to guide the IC card to be inserted/removed is provided in an inner side surface of said frame, and said heart-shaped cam groove is provided in an outer side surface of said frame.

8. A connector device according to claim 7, wherein a plurality of guide portions to individually guide a plurality of IC cards to be inserted/removed are provided in an inner side surface of said frame, and a plurality of push rods to individually eject the IC cards in inserted status are provided in an outer side surface of said frame.

* * * * *

UNITED STATES PATENT AND TRADEMARK OFFICE
CERTIFICATE OF CORRECTION

PATENT NO. : 6,095,835　　　　　　　　　　　　　　　　　　　　Page 1 of 1
DATED　　　: August 1, 2000
INVENTOR(S) : Wataru Oguchi It is certified that error appears in the above-identified patent and that said Letters Patent is hereby corrected as shown below:

Claim 1,
Line 10, change "heat-shaped" to -- heart-shaped --.

Signed and Sealed this

Twenty-sixth Day of February, 2002

*Attest:*

*Attesting Officer*　　　　　JAMES E. ROGAN
　　　　　　　　　　　　*Director of the United States Patent and Trademark Office*